US008035148B2

(12) United States Patent
Goldstein

(10) Patent No.: US 8,035,148 B2
(45) Date of Patent: Oct. 11, 2011

(54) MICROMACHINED TRANSDUCER INTEGRATED WITH A CHARGE PUMP

(75) Inventor: Stephan Goldstein, North Reading, MA (US)

(73) Assignee: Analog Devices, Inc., Norwood, MA (US)

(*) Notice: Subject to any disclaimer, the term of this patent is extended or adjusted under 35 U.S.C. 154(b) by 1508 days.

(21) Appl. No.: 11/435,507

(22) Filed: May 17, 2006

(65) Prior Publication Data

US 2006/0260400 A1 Nov. 23, 2006

Related U.S. Application Data

(60) Provisional application No. 60/681,599, filed on May 17, 2005.

(51) Int. Cl.
*H01L 29/86* (2006.01)

(52) U.S. Cl. .......................................................... 257/299

(58) Field of Classification Search .................. 257/299
See application file for complete search history.

(56) References Cited

U.S. PATENT DOCUMENTS

| | | | | |
|---|---|---|---|---|
| 4,024,349 | A | 5/1977 | O'Neill | 370/266 |
| 4,052,623 | A | 10/1977 | Loberg | 327/304 |
| 4,170,740 | A | 10/1979 | Pernyeszi | 327/434 |
| 4,451,748 | A | 5/1984 | Amrany | 327/390 |
| 5,159,543 | A | 10/1992 | Yamawaki | 363/60 |
| 5,539,351 | A | 7/1996 | Gilsdorf | 327/379 |
| 5,659,269 | A | 8/1997 | Myers | 331/17 |
| 5,663,675 | A | 9/1997 | O'Shaughnessy | 327/553 |
| 5,808,502 | A * | 9/1998 | Hui et al. | 327/333 |
| 5,828,620 | A | 10/1998 | Foss et al. | 365/226 |
| 5,880,634 | A | 3/1999 | Babanezhad | 330/126 |
| 5,905,404 | A | 5/1999 | Nagaraj | 327/390 |
| 5,982,315 | A | 11/1999 | Bazarjani et al. | 341/143 |
| 6,060,937 | A | 5/2000 | Singer et al. | 327/390 |
| 6,072,354 | A | 6/2000 | Tachibana et al. | 327/390 |
| 6,118,326 | A | 9/2000 | Singer et al. | 327/390 |
| 6,147,547 | A | 11/2000 | Ogura et al. | 327/536 |
| 6,288,458 | B1 * | 9/2001 | Berndt | 307/130 |
| 6,329,848 | B1 | 12/2001 | Maes et al. | 327/94 |
| 6,437,608 | B1 | 8/2002 | Miyabe et al. | 327/96 |
| 6,538,491 | B1 | 3/2003 | Spanoche | 327/337 |
| 6,556,067 | B2 | 4/2003 | Henry | 327/536 |
| 6,559,689 | B1 | 5/2003 | Clark | 327/97 |
| 6,683,514 | B2 | 1/2004 | Fujimoto | 333/173 |
| 6,693,479 | B1 | 2/2004 | Bardsley | 327/390 |
| 6,731,155 | B2 | 5/2004 | Hakkarainen et al. | 327/390 |
| 6,750,796 | B1 | 6/2004 | Holloway et al. | 341/143 |
| 6,768,374 | B1 | 7/2004 | Lee | 330/9 |
| 6,884,950 | B1 | 4/2005 | Nicholson et al. | 200/181 |

(Continued)

OTHER PUBLICATIONS

Abo et al. "*A, 1.5-V, 10-bit, 14.3-MS/s CMOS Pipeline Analog-to-Digital Converter*", IEEE Journal of Solid-State Circuit, vol. 34, No. 5, pp. 599-605, May 1999.

*Primary Examiner* — Mary Wilczewski
*Assistant Examiner* — Toniae Thomas
(74) *Attorney, Agent, or Firm* — Sunstein Kann Murphy & Timbers LLP

(57) ABSTRACT

An integrated circuit includes a micromachined transducer and a charge pump. More particularly, on one silicon substrate, a control circuit delivers high voltage from the charge pump to operate the transducer. An electronic apparatus, such as a cell phone or automatic test equipment may include such an integrated circuit.

47 Claims, 5 Drawing Sheets

U.S. PATENT DOCUMENTS

| | | | | |
|---|---|---|---|---|
| 6,992,509 | B2 | 1/2006 | Ko et al. | 327/96 |
| 2002/0095187 | A1 * | 7/2002 | Thompson et al. | 607/9 |
| 2002/0096421 | A1 * | 7/2002 | Cohn et al. | 200/181 |
| 2003/0202497 | A1 | 10/2003 | Csapo | 370/388 |
| 2005/0212586 | A1 * | 9/2005 | Daga et al. | 327/536 |
| 2006/0084875 | A1 * | 4/2006 | Knight | 600/462 |

* cited by examiner

MICROMACHINED TRANSDUCER INTEGRATED WITH A CHARGE PUMP

This application claims priority from U.S. Provisional Patent Application No. 60/681,599. filed May 17, 2005, the full disclosure of which is hereby incorporated by reference herein.

BACKGROUND OF THE INVENTION

The present invention relates to micromachined transducers, such as relays and switches and more specifically to providing the necessary high voltage levels needed for operation of the transducer.

It is known in the prior art to use micromachined relays. Micromachined relays require large voltages for closure of the gate of the relay which are usually on the order of 40-60 Volts. When micromachined relays are used with other types of circuitry, two separate voltage supplies are necessary. One supply is for the logic level circuitry, usually at no more than five volts and typically 3.3V and one supply is for the relay (40-60V). Thus, such circuitry requires the redundancy and expense of the two voltage supplies. Additionally, in the past, micromachined relays have been placed on separate silicon from logic level circuitry to avoid the high voltage requirements of the relay from damaging the low voltage circuitry, if any of the voltage signal leaks through the silicon.

SUMMARY OF THE INVENTION

Embodiments of the invention combine a micromachined transducer and a charge pump in a single integrated circuit. The charge pump generates a voltage higher than the threshold voltage of the micromachined transducer. The integrated circuit is provided with a lower voltage such as the logic level voltage for sourcing the charge pump and for controlling the use of the high voltage to operate the transducer.

In particular embodiments, the micromachined transducer, the charge pump and a logic level control circuit are all formed on the same silicon substrate. The integrated circuit lacks any input as high as the transducer's threshold voltage. Examples of micromachined transducers with threshold voltages higher than the logic level, and more particularly at least 40 volts, include micromachined switching devices such as a switch or a relay. The logic level control circuit is responsive to low voltage signals no higher than 5 volts.

In accordance with a further embodiment of the invention, an electronic apparatus having a high voltage switch controlled by low voltage control signals is made to include an integrated circuit. The integrated circuit of the embodiment including the high voltage switch, a charge pump and a control circuit. The high voltage switch may act as a transmit/receive switch in a cellular telephone. Alternatively, the electronic apparatus may be an automatic test equipment.

The charge pump used in embodiments of the invention may include a plurality of capacitors that are connected in series wherein each capacitor is capable of holding a charge. The capacitors may be switched capacitors wherein each subsequent capacitor in the series is capable of holding a larger amount of charge. In other embodiments, different types of charge pumps may be employed as are known in the art.

BRIEF DESCRIPTION OF THE DRAWINGS

The foregoing features of the invention will be more readily understood by reference to the following detailed description, taken with reference to the accompanying drawings, in which.

DETAILED DESCRIPTION OF SPECIFIC EMBODIMENTS

As used herein, unless defined more specifically otherwise, "low voltage" encompasses any voltage below the threshold voltage of a micromachined transducer on the integrated circuit. The term "logic level voltage" refers to the voltage used by the logic circuits on an integrated circuit, typically 3.3 volts, but other levels such as 5 volts have been used.

As used herein, unless defined more specifically otherwise, high voltage refers to a voltage at least as high as the threshold voltage of a micromachined transducer on the integrated circuit, wherein the threshold voltage is higher than the logic level voltage on the integrated circuit. Without limiting this definition, it is noted that in many particular embodiments, the high voltage is at least three times the logic level voltage.

Figure 1:
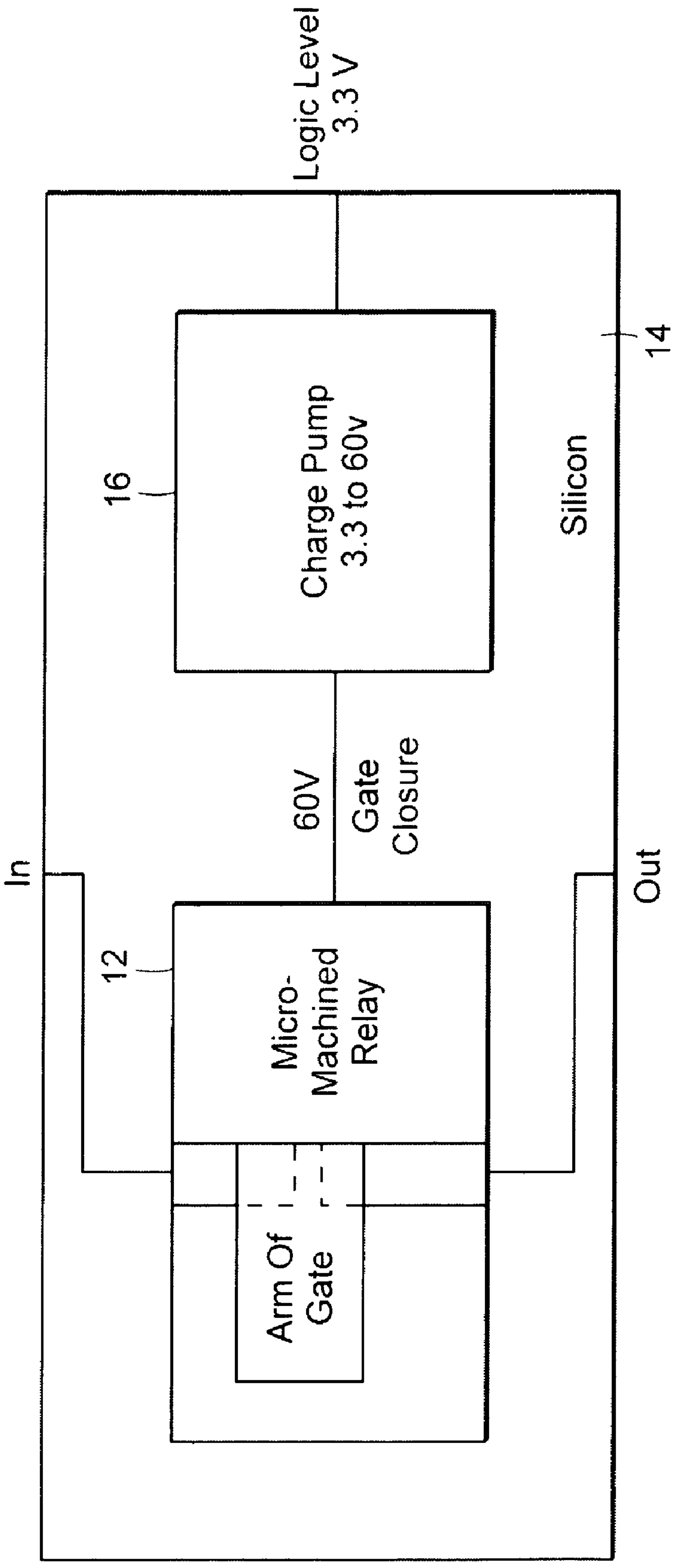
FIG. 1 is a schematic block diagram of an integrated circuit of an embodiment of the present invention.

A micromachined transducer is responsive to a threshold voltage. For example, micromachined relays or switches typically require in excess of 40V to close the contacts. In general, modern circuit designs operate with logic levels having voltages below such threshold voltage levels. In accordance with an embodiment of the present invention as shown in FIG. 1, a micromachined transducer, in particular, a relay 12 is formed on a silicon substrate 14 along with a charge pump 16. The charge pump boosts the logic supply voltage high enough to provide reliable closure of the physical relay contacts, while still permitting logic-level control from the outside world. Charge pumps are operated at low power levels and are fairly efficient, and as the relay is electrostatic and uses virtually no power, this is a natural combination.

The threshold voltage of relay 12 relates to the spacing between the relay arm and the substrate. A larger spacing makes the relay easier and less costly to manufacture, but results in a larger threshold voltage. To produce relays with smaller spacing and threshold voltages at logic levels, would be very costly and difficult. Demand for a reliably accurate threshold voltage would result in a low manufacturing yield of such logic level relays. By including the charge pump 16 in the integrated circuit, a higher voltage is made available on the IC for operation of the relay. This allows the opening and closing of the relay contacts under logic-level control, permitting the use of relatively relaxed spacing between the arm and the substrate. This provides a straightforward path to quite low operational thresholds while reducing the yield impact of the extremely small physical dimensions which would be required to implement direct logic-level control of the relay. A 44V CMOS analog switch process could create a sufficient voltage with a charge pump to operate a micromachined relay structure.

A charge pump can take a logic level input and boost it up to a high voltage, over 40 volts, if needed. Charge pumps may include a plurality of capacitors that are connected in series wherein each capacitor is capable of holding a charge. The capacitors may be switched capacitors wherein each subsequent capacitor in the series is capable of holding a larger amount of charge. Any of a variety of known charge pumps may be implemented on an integrated circuit in accordance with embodiments of the invention, including Cockcroft-Walton, Pelliconi and Dickson charge pumps.

Figure 2:
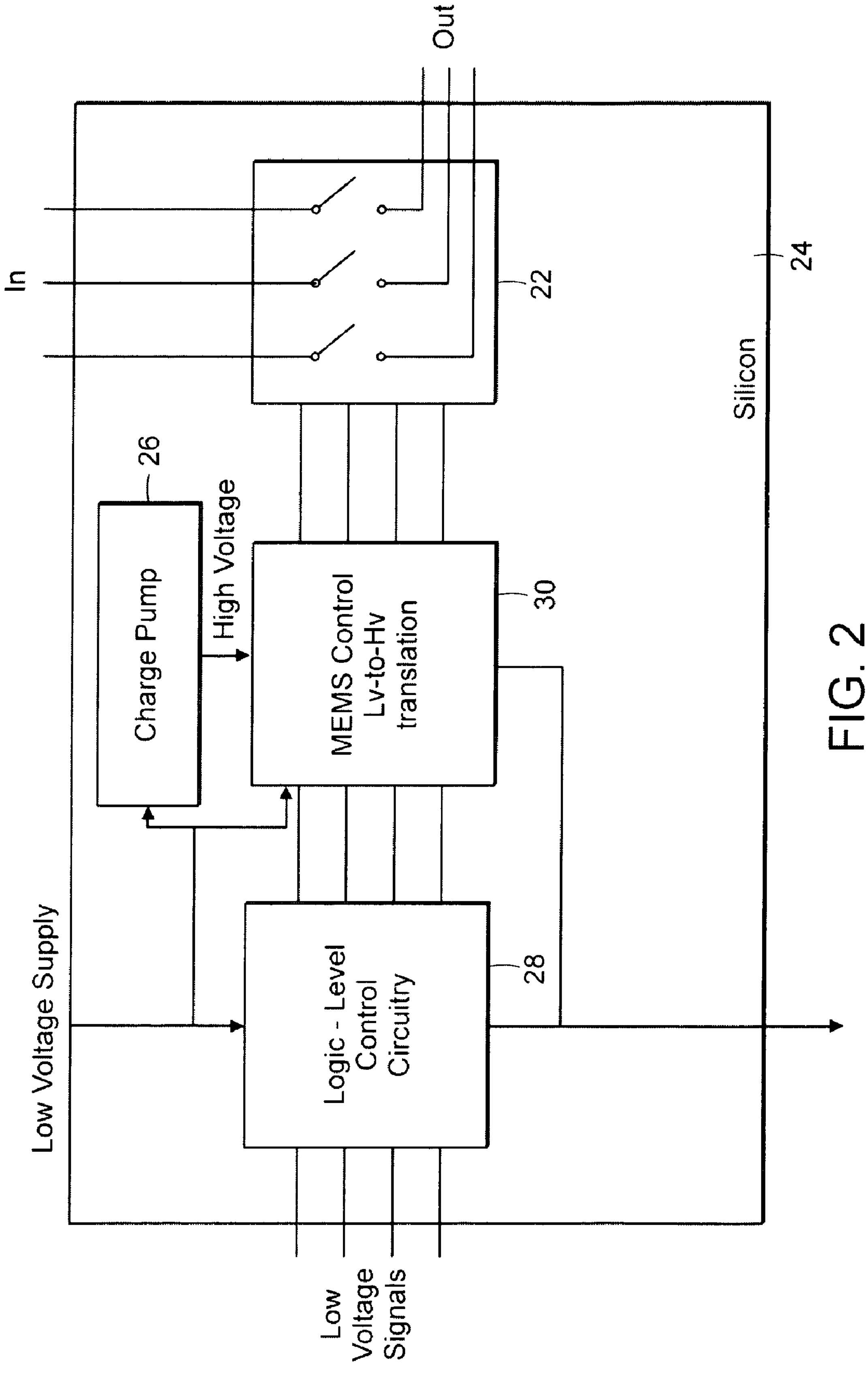
FIG. 2 is a schematic block diagram of an integrated circuit of an embodiment of the present invention.
Figure 3:
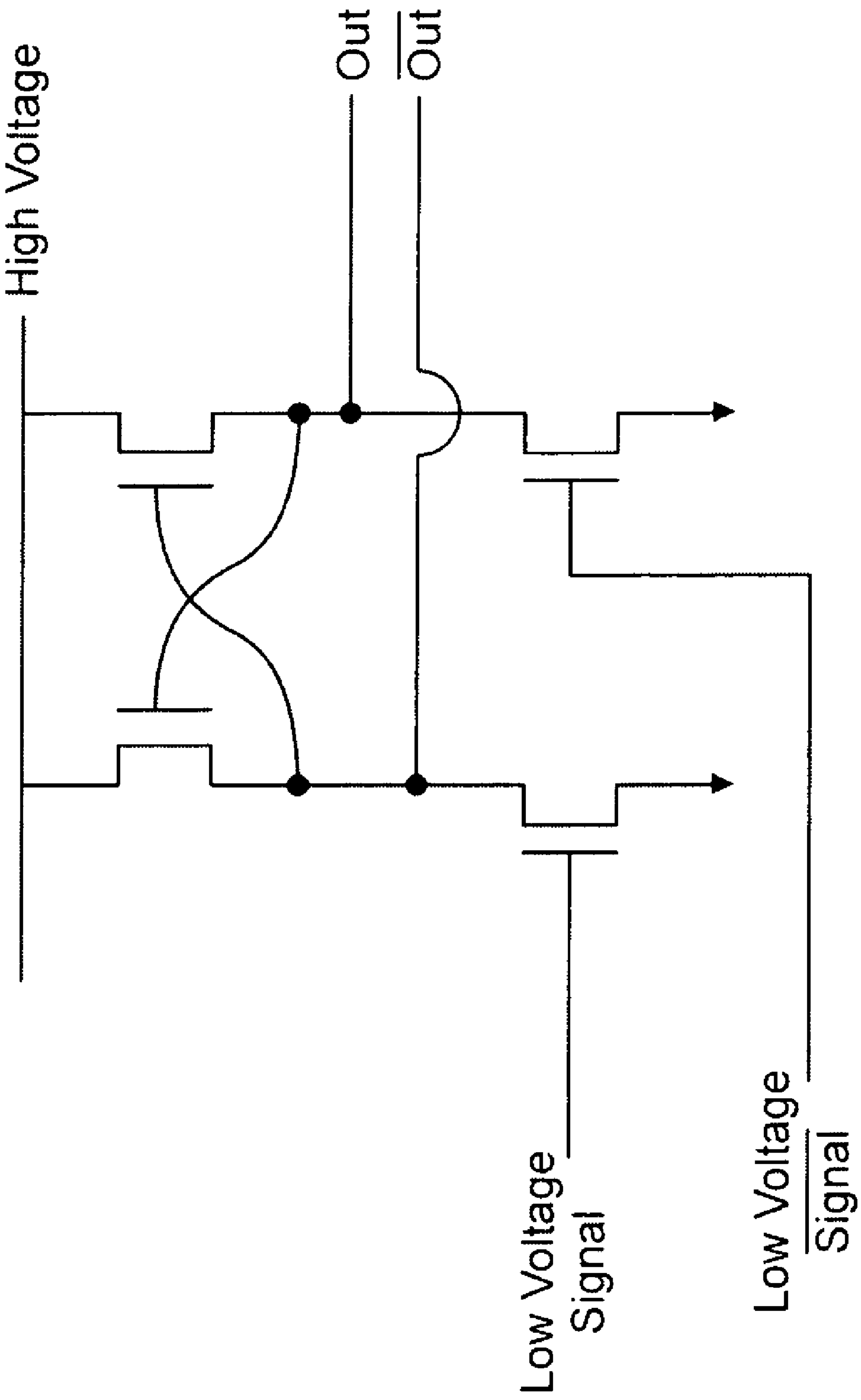
FIG. 3 is a schematic circuit diagram of an example of a level translator for use in the MEMS control circuit of FIG. 2.

An integrated circuit is shown in greater detail in FIG. 2. A micromachined transducer 22, a charge pump 26 and a control circuit, including logic level control circuitry 28 and MEMS control circuitry 30 are all formed on a silicon substrate 24. Control signals, no greater than 5 volts, more typically logic level signals at 3.3 volts are applied to the logic level control circuitry 28 to effectuate operation of the micromachined transducer 22. Despite a lack of external inputs to the integrated circuit having a voltage as high as the threshold voltage of the transducer 22, control is achieved with help of the charge pump 26 to generate a high voltage at least as high as the threshold voltage of the transducer 22. The MEMS control circuitry 30 is a low voltage-to-high voltage level translation circuit controlled by the logic level control circuitry 28 to control delivery of the high voltage from the charge pump to the transducer. An example of a simple low voltage-to-high voltage level translation circuit is shown in FIG. 3.

The micromachined transducer 22 may include one or more switching devices. A switching device may be a switch or a relay in preferred embodiments. The switching device is responsive to a high voltage actuation signal, which must be at least as high as the threshold voltage of the device. The charge pump generates the high voltage that makes actuation of the switching device on the integrated circuit possible when the MEMS control circuit delivers the high voltage to the device.

Constructing an integrated circuit that can power a micromachined transducer without high voltage inputs can reduce the size and cost of an electronic apparatus. An electronic apparatus such as a cellular telephone can use such an integrated circuit as its transmit/receive switch and eliminate a need for multiple IC's. In a cellular phone, the sensitive receiver section needs to be protected from the high-power signals produced by the transmitter section when the user is transmitting (i.e. speaking). Various solutions are employed today, such as relays or PIN-diode switches, both of which consume a lot of power and cannot be integrated onto the main cellular phone chip or the power amplifier chip. A present-generation MEMs-based switching scheme would greatly reduce power needs but requires an additional high-voltage power supply. In accordance with embodiments of the present invention, the need for an additional power supply is overcome by integrating the charge pump on the integrated circuit of the MEMS high voltage switch.

Figure 4:
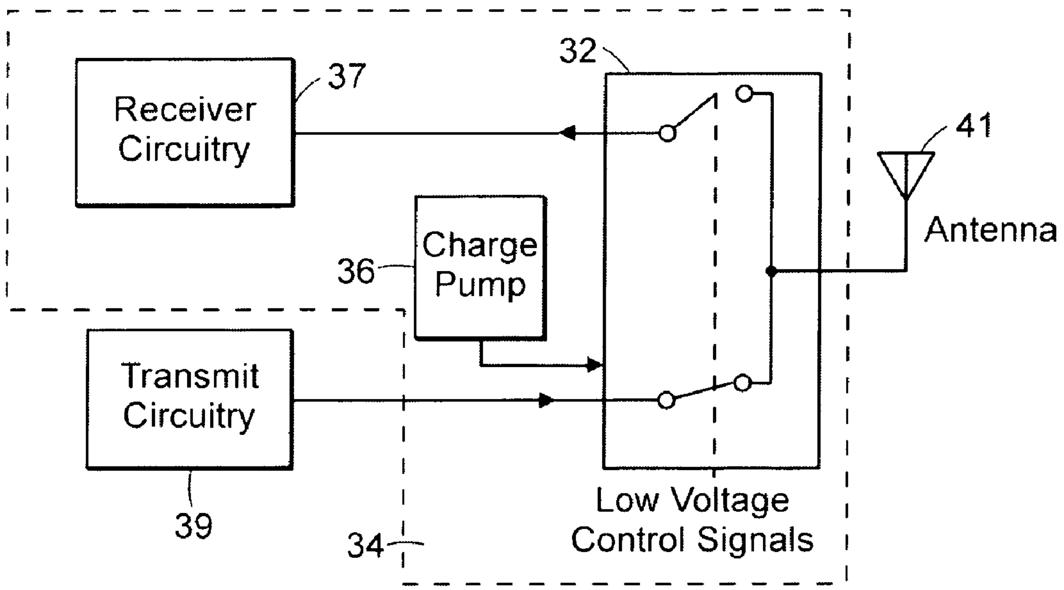
FIG. 4 is a schematic block diagram of a cellular telephone embodiment of the present invention.
Figure 5:
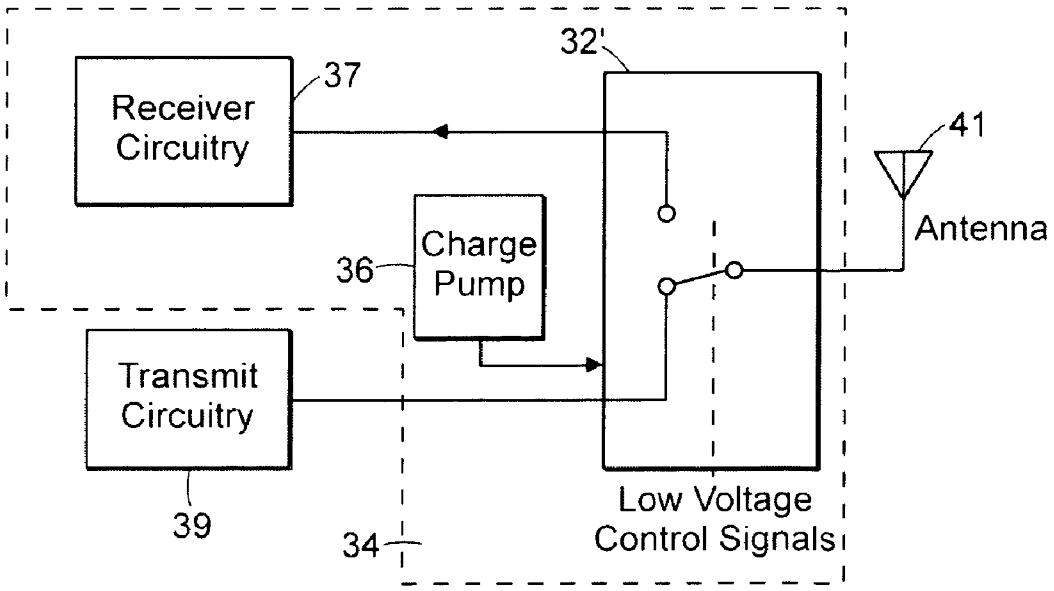
FIG. 5 is a schematic block diagram of an alternative embodiment of a cellular telephone of the present invention.
Figure 6:
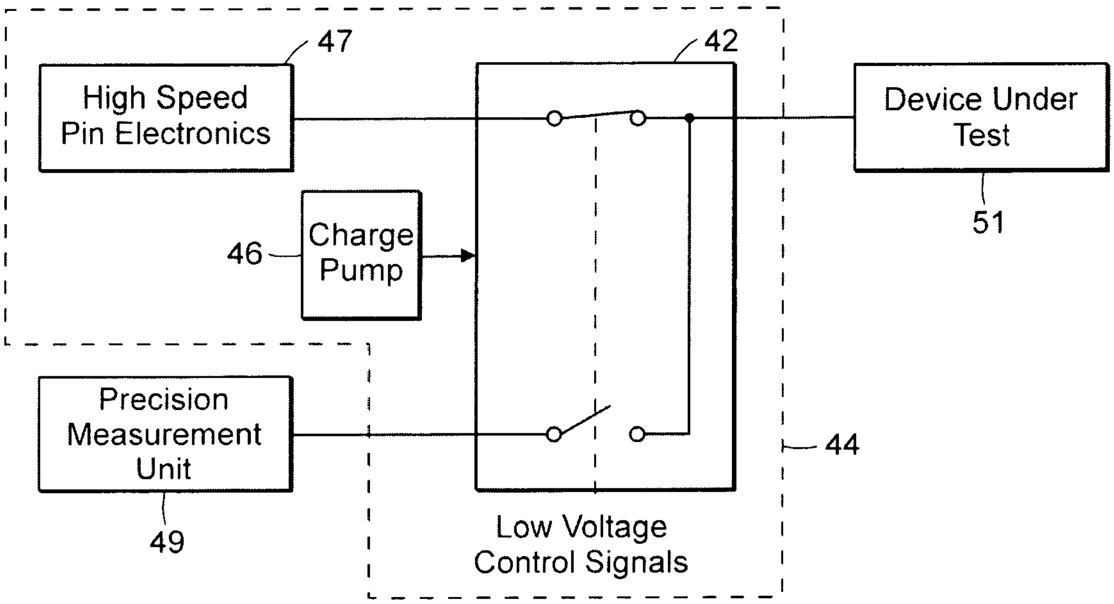
FIG. 6 is a schematic block diagram of an automatic test equipment of the present invention.

In accordance with a first cellular telephone of the present invention as shown in FIG. 4, a transmit/receive selector switch 32 is a micromachined transducer including two SPST switches that are driven out of phase, i.e. when one is closed the other is open. The switch 32 and a charge pump 36 are formed on silicon substrate 34. In addition, it is economical to further include a receiver circuitry 37 also on the silicon. The switch 32 is controlled by low voltage control signals through the control circuitry on the silicon substrate 34, the circuitry typically including logic level control circuitry and a level translator. The cellular telephone includes transmit circuitry electrically coupled to the transmit/receive switch so that the transmitter and receiver are alternately connected to the cell phone's antenna 41. In accordance with an alternate embodiment as shown in FIG. 5, the transmit/receive switch 32' is implemented with a single SPDT switch.

Automatic test equipment ("ATE") for testing devices under test (DUT) are another electronic apparatus that typically requires switches or relays. A typical pin channel in an ATE must perform two very different functions. In one case it must measure functional performance at very high speeds; in this case, the timing accuracy of edge placement is critical and the use of transmission line techniques with accurate matching is mandated. In the other case, the channel must perform highly accurate voltage and current measurements at relatively low speeds.

Relays are commonly used to isolate the two measurement functions from each other in an ATE channel. However, relays appropriate for use in the high-speed transmission line environment are relatively expensive and consume considerable power and area. In accordance with embodiments of the present invention, an automated test equipment is provided with an integrated circuit on a silicon substrate 44 that includes the high voltage switch 42 and a charge pump 46 to generate the high voltage. The switch and charge pump can be further integrated with the ATE pin electronics 47. As with the cellular telephone, the isolation can be provided by using two SPST switches as shown or, alternatively, using an SPDT switch. The switch 42 is controlled by low voltage control signals through logic level control circuitry and a level translator to put either the pin electronics or the precision measurement unit in connection with the device under test 51. Moreover, in a further alternate embodiment not shown, the silicon substrate 44 can be populated with the precision measurement unit 49 of the ATE.

Of course, it should be understood that various changes and modifications to the preferred embodiments described above will be apparent to those skilled in the art. For example, a variety of receiver circuitry or pin electronics circuitry may be employed on the integrated circuit of the corresponding electronic apparatus. This and other changes can be made without departing from the spirit and scope of the invention, and without diminishing its attendant advantages. It is therefore intended that such changes and modifications be covered by the following claims.

I claim:

1. An integrated circuit comprising:

a MEMS transducer responsive to a threshold voltage;

a charge pump for generating a high voltage at least as high as the threshold voltage; and a logic level control circuit on said integrated circuit that controls the high voltage so as to operate the transducer, said logic level control circuit including a low voltage-to-high voltage level translation circuit.

2. The integrated circuit of claim 1 further comprising a silicon substrate and wherein the MEMS transducer and the charge pump are formed on said substrate.

3. The integrated circuit of claim 1 further comprising a silicon substrate and wherein the MEMS transducer, the charge pump and the logic level control circuit are all formed on said substrate.

4. The integrated circuit of claim 1 wherein said MEMS transducer comprises a switch.

5. The integrated circuit of claim 1 wherein said MEMS transducer comprises a relay.

6. The integrated circuit of claim 1 wherein the threshold voltage is at least 40 volts.

7. The integrated circuit of claim 6 wherein said control circuit is responsive to control signals no higher than 5 volts.

8. The integrated circuit of claim 1 wherein the charge pump comprises a series of switched capacitors.

9. An integrated circuit comprising:

an input for receiving a low voltage control signal;

a MEMS switching device responsive to a high voltage actuation signal;

a charge pump for generating a high voltage; and a control circuit coupled to the input, the MEMS switching device and the charge pump for controlling delivery of the high voltage to the switching device in response to the low voltage control signal, wherein said control circuit includes a low voltage-to-high voltage level translation circuit.

10. The integrated circuit of claim 9 further comprising a silicon substrate and wherein the MEMS switching device, the charge pump and the control circuit are all formed on said substrate.

11. The integrated circuit of claim 9 wherein the high voltage actuation signal is at least 40 volts.

12. The integrated circuit of claim 11 wherein the low voltage control signal is no higher than 5 volts.

13. The integrated circuit of claim 9 wherein the charge pump comprises a series of switched capacitors.

14. An electronic apparatus having low voltage control signals and a MEMS switching device responsive to a high voltage actuation signal comprising:

an integrated circuit including thereon the MEMS switching device, a charge pump for generating a high voltage, and a control circuit, the control circuit being coupled to receive the low voltage control signals and coupled to the charge pump for delivering the high voltage to the MEMS switching device in response to the low voltage control signals, wherein the electronic apparatus comprises a cellular telephone.

15. An electronic apparatus having low voltage control signals and a MEMS switching device responsive to a high voltage actuation signal comprising:

an integrated circuit including thereon the MEMS switching device, a charge pump for generating a high voltage, and a control circuit, the control circuit being coupled to receive the low voltage control signals and coupled to the charge pump for delivering the high voltage to the MEMS switching device in response to the low voltage control signals, wherein the electronic apparatus comprises an automatic test equipment used for testing integrated circuits.

16. The electronic apparatus of claim 15 wherein the integrated circuit further includes pin electronics thereon.

17. The integrated circuit of claim 1 wherein said integrated circuit lacks any external inputs for receiving a voltage at least as high as the threshold voltage.

18. An integrated circuit comprising:

a MEMS transducer responsive to a threshold voltage, wherein the threshold voltage is at least 40 volts;

a charge pump for generating a high voltage at least as high as the threshold voltage; and a logic level control circuit on said integrated circuit that controls the high voltage so as to operate the transducer.

19. The integrated circuit of claim 18 further comprising a silicon substrate and wherein the MEMS transducer and the charge pump are formed on said substrate.

20. The integrated circuit of claim 18 further comprising a silicon substrate and wherein the MEMS transducer, the charge pump and the logic level control circuit are all formed on said substrate.

21. The integrated circuit of claim 18 wherein said MEMS transducer comprises a switch.

22. The integrated circuit of claim 18 wherein said MEMS transducer comprises a relay.

23. The integrated circuit of claim 18 wherein said control circuit is responsive to control signals no higher than 5 volts.

24. The integrated circuit of claim 18 wherein the charge pump comprises a series of switched capacitors.

25. The integrated circuit of claim 18 wherein said integrated circuit lacks any external inputs for receiving a voltage of 40 volts or higher.

26. An integrated circuit comprising:

an input for receiving a low voltage control signal;

a MEMS switching device responsive to a high voltage actuation signal of at least 40 volts;

a charge pump for generating a high voltage of at least 40 volts; and a control circuit coupled to the input, the MEMS switching device and the charge pump for controlling delivery of the high voltage as the high voltage actuation signal to the switching device in response to the low voltage control signal.

27. The integrated circuit of claim 26 further comprising a silicon substrate and wherein the MEMS switching device, the charge pump and the control circuit are all formed on said substrate.

28. The integrated circuit of claim 26 wherein the low voltage control signal is no higher than 5 volts.

29. The integrated circuit of claim 26 wherein the charge pump comprises a series of switched capacitors.

30. An integrated circuit comprising:

a MEMS transducer responsive to an actuation signal relative to a threshold voltage;

a charge pump for generating a high voltage at least as high as the threshold voltage;

a logic level control circuit on said integrated circuit coupled to the MEMS transducer so as to control delivery of the high voltage as the actuation signal to the MEMS transducer so as to operate the transducer; and wherein said integrated circuit lacks any external inputs for receiving a voltage at least as high as the threshold voltage.

31. The integrated circuit of claim 30 further comprising a silicon substrate and wherein the MEMS transducer and the charge pump are formed on said substrate.

32. The integrated circuit of claim 30 further comprising a silicon substrate and wherein the MEMS transducer, the charge pump and the logic level control circuit are all formed on said substrate.

33. The integrated circuit of claim 30 wherein said logic level control circuit includes a low voltage-to-high voltage level translation circuit.

34. The integrated circuit of claim 30 wherein the threshold voltage is at least 40 volts.

35. The integrated circuit of claim 34 wherein said control circuit is responsive to control signals no higher than 5 volts.

36. The integrated circuit of claim 30 wherein the charge pump comprises a series of switched capacitors.

37. An integrated circuit comprising:

a MEMS transducer responsive to an actuation signal relative to a threshold voltage;

a charge pump for generating a high voltage at least as high as the threshold voltage; and a logic level control circuit on said integrated circuit coupled to the MEMS transducer so as to control delivery of the high voltage as the actuation signal to the MEMS transducer so as to operate the transducer, said logic level control circuit including a low voltage-to-high voltage level translation circuit.

38. The integrated circuit of claim 37 further comprising a silicon substrate and wherein the MEMS transducer and the charge pump are formed on said substrate.

39. The integrated circuit of claim 37 further comprising a silicon substrate and wherein the MEMS transducer, the charge pump and the logic level control circuit are all formed on said substrate.

40. The integrated circuit of claim 37 wherein the threshold voltage is at least 40 volts.

41. The integrated circuit of claim 37 wherein said control circuit is responsive to control signals no higher than 5 volts.

42. The integrated circuit of claim 37 wherein the charge pump comprises a series of switched capacitors.

43. An integrated circuit comprising:

a MEMS transducer responsive to an actuation signal relative to a threshold voltage at least as high as 40 volts;

a charge pump for generating a high voltage at least as high as the threshold voltage; and a logic level control circuit on said integrated circuit coupled to the MEMS transducer so as to control delivery of the high voltage as the actuation signal to the MEMS transducer so as to operate the transducer.

44. The integrated circuit of claim 43 further comprising a silicon substrate and wherein the MEMS transducer and the charge pump are formed on said substrate.

45. The integrated circuit of claim 43 further comprising a silicon substrate and wherein the MEMS transducer, the charge pump and the logic level control circuit are all formed on said substrate.

46. The integrated circuit of claim 43 wherein said control circuit is responsive to control signals no higher than 5 volts.

47. The integrated circuit of claim 43 wherein the charge pump comprises a series of switched capacitors.

* * * * *